(12) United States Patent
Budge et al.

(10) Patent No.: US 6,617,230 B2
(45) Date of Patent: Sep. 9, 2003

(54) USE OF SELECTIVE OZONE TEOS OXIDE TO CREATE VARIABLE THICKNESS LAYERS AND SPACERS

(75) Inventors: William Budge, Homedale, ID (US); Gurtej S. Sandhu, Boise, ID (US); Christopher W. Hill, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/955,503

(22) Filed: Sep. 18, 2001

(65) Prior Publication Data

US 2002/0025666 A1 Feb. 28, 2002

Related U.S. Application Data

(62) Division of application No. 09/652,188, filed on Aug. 31, 2000, now Pat. No. 6,368,986.

(51) Int. Cl.[7] .......................................... H01L 21/4763
(52) U.S. Cl. ........................ 438/595; 438/778; 438/787; 438/788
(58) Field of Search ................................ 438/778, 787, 438/788, 595

(56) References Cited

U.S. PATENT DOCUMENTS

| 4,470,852 | A | | 9/1984 | Ellsworth | 148/1.5 |
|---|---|---|---|---|---|
| 4,717,678 | A | | 1/1988 | Goth | 437/27 |
| 5,399,513 | A | | 3/1995 | Liou et al. | 437/34 |
| 5,665,644 | A | | 9/1997 | Sandhu | 438/641 |
| 5,855,957 | A | | 1/1999 | Yuan | 427/255.3 |
| 5,882,993 | A | * | 3/1999 | Gardner et al. | 438/591 |
| 6,050,506 | A | | 4/2000 | Guo et al. | 239/558 |
| 6,090,693 | A | * | 7/2000 | Gonzalez et al. | 438/592 |
| 6,149,974 | A | * | 11/2000 | Nguyen et al. | 427/255.29 |

FOREIGN PATENT DOCUMENTS

| JP | 406283526 A | 10/1994 | H01L/21/3205 |
|---|---|---|---|

\* cited by examiner

Primary Examiner—Son T. Dinh
Assistant Examiner—Pho M. Luu
(74) Attorney, Agent, or Firm—Whyte Hirschboeck Dudek SC

(57) ABSTRACT

A process for selectively depositing a silicon oxide layer onto silicon substrates of different conductivity types is described. The silicon oxide layer is formed by the ozone decomposition of TEOS at relatively low temperatures and relatively high pressures. Compared to the deposition rate on exposed regions on non-doped silicon, the silicon oxide deposits at a faster rate on exposed regions of P-type silicon and at a slower rate on exposed regions of N-type silicon.

19 Claims, 2 Drawing Sheets

USE OF SELECTIVE OZONE TEOS OXIDE TO CREATE VARIABLE THICKNESS LAYERS AND SPACERS

CROSS-REFERENCE TO RELATED APPLICATIONS

This application is a division of U.S. Pat. Application Serial No. 09/652,188, filed Aug. 31, 2000 now U.S. Pat. No. 6,368,986 issued.

FIELD OF THE INVENTION

This invention relates to the fabrication of semiconductor devices. More particularly, this invention relates to selective deposition of silicon oxide onto silicon substrates.

BACKGROUND OF THE INVENTION

Optimization of semiconductor fabrication sometimes requires a thicker nonconducting film on some components than on other components. For example, a thick oxide layer or spacer on a P-type silicon wordline may he desired because the boron implants diffuse readily to an adjacent layer. In contrast, an N-type polysilicon component may optimally require a thinner oxide layer or spacer since N-type dopants do not diffuse as readily. A simple process that provides different thickness nonconducting films and spacers is desired in semiconductor fabrication.

Forming oxide layers and spacers of different thicknesses over varying silicon substrates using current methods requires the application of a first mask over select parts of the semiconductor device and then depositing a layer of silicon oxide over the unmasked parts of the semiconductor device. The first mask is then removed and a second mask is applied over the parts that have been coated with the first silicon oxide layer leaving other parts unmasked. Subsequently, a second silicon oxide layer is deposited on the unmasked parts. Finally, an etch is used to remove silicon oxide from select surfaces, leaving behind an oxide layer or spacers where desired. This process adds a number of steps to the manufacturing procedures thereby increasing the complexity of the fabrication. As such, semiconductors are typically manufactured oxide with oxide layers or spacers of an intermediate thickness that will work acceptably, although not optimally, for either P-type or N-type polysilicons substrate.

A hallmark of the current invention is the provision of a process that selectively deposits silicon oxide based on the conductivity type of the underlying silicon substrate.

SUMMARY OF THE INVENTION

The current invention is a method for selectively depositing silicon oxide onto a silicon-comprising surface wherein the selectivity is based on the conductivity type of the silicon. In one embodiment, the invention is a semiconductor processing method for selectively depositing silicon oxide onto silicon, the method comprising the steps of: (i) providing a silicon-comprising substrate having exposed regions of different type conductivity; (ii) contacting the substrate with ozone and tetraethylorthosilicate (TEOS) gases; and, (iii) reacting the ozone and TEOS in contact with the substrate to selectively deposit silicon oxide onto the substrate, such that, compared to the deposition rate on exposed regions of non-doped silicon, the silicon oxide deposits at a faster rate on exposed regions of P-type silicon and at a slower rate on exposed regions of N-type silicon.

Another embodiment of the invention is a method for forming an oxide layer of varying thickness on a silicon-comprising substrate, the method comprising the steps of: (i) providing the silicon-comprising substrate having a surface and comprising at least a first and second region of different type conductivity; and (ii) depositing silicon oxide onto the substrate in a single process step, to form an oxide layer over the first and second conductivity regions; whereby oxide layer overlying the first conductivity region has a first thickness and the oxide layer overlying the second conductivity region has a second thickness that is greater than the first thickness.

Another embodiment of the invention is a semiconductor processing method of forming spacers of variable thickness, the method comprising providing a silicon-comprising substrate having a surface comprising at least one first P-type silicon structure or protrusion and at least one second structure or protrusion, provided that: (1) when the first protrusion comprises P-type or non-doped silicon, then the second structure or protrusion comprises either non-doped silicon or N-type silicon; and (2) when the first protrusion comprises non-doped silicon, then the second structure or protrusion comprises N-type silicon. Next, TEOS is decomposed with ozone to selectively deposit silicon oxide over the silicon surface and both the first protrusion and the second protrusion, such that a greater thickness of silicon oxide is deposited on the first protrusion than on the second protrusion. Finally, the deposited silicon oxide is etched to remove the oxide from select areas and leave silicon oxide as a layer or as formed spacers of variable thickness around the first protrusion and the second protrusion.

Another embodiment of the invention is a semiconductor processing method of forming wordlines with an oxide layer or formed spacers of variable thickness. The method of this embodiment comprises providing a silicon-comprising substrate having a surface comprising at least one first wordline comprising P-type silicon and at least one second wordline comprising N-type silicon. Next, TEOS is decomposed with ozone to selectively deposit silicon oxide over the substrate surface and over both the first wordline and the second wordline, such that a greater thickness of silicon oxide is deposited on the first wordline than on the second wordline. Then, the silicon oxide deposited on the substrate during the reaction step is etched to provide a silicon oxide layer or formed spacers of variable thickness around the first wordline and the second wordline.

Another embodiment of the invention is a semiconductor processing method of forming gates with spacers of variable thickness. The method of this embodiment comprises providing a silicon-comprising substrate having a surface comprising at least one first gate comprising P-type silicon-comprising material and at least one second gate comprising N-type silicon-comprising material. Next, TEOS is decomposed with ozone to selectively deposit silicon oxide over the substrate surface and over both the first gate and the second gate, such that a greater thickness of silicon oxide is deposited on the first gate than on the second gate. Then, the silicon oxide deposited on the substrate during the reaction step is etched to leave a silicon oxide layer or formed spacers of variable thickness around the first gate and the second gate.

Another embodiment of the invention is a memory device comprising at least a first wordline comprising P-type silicon-comprising material and at least a second wordline comprising N-type silicon-comprising material, wherein both the first wordline and the second wordline have non-conductive spacers comprising silicon oxide wherein the nonconductive layer or formed spacer for the first wordline is thicker than the nonconductive layer or spacer for the second wordline.

Another embodiment of the invention is a multi-gate semiconductor device comprising at least one gate comprising (i) P-type silicon-comprising material, (ii) at least one second gate comprising N-type silicon-comprising material and, (iii) layer or a nonconductive layer or formed spacers around each of the first and second gates, wherein the nonconductive layer or spacer is thicker for the first gate than for the second gate.

BRIEF DESCRIPTION OF THE DRAWINGS

Preferred embodiments of the invention are described below with reference to the following accompanying drawings, which are for illustrative purposes only. Throughout the following views, reference numerals will be used in the drawings, and the same reference numerals will be used throughout the several views and in the description to indicate same or like parts.

DETAILED DESCRIPTION

In the following detailed description, references are made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention.

The terms "wafer" or "substrate" used in the following description include any semiconductor-based structure having an exposed polysilicon or other silicon-comprising surface in which to form the silicon oxide deposition layer of this invention. Wafer and substrate are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when references made to a wafer or substrate in the following description, previous process steps may have been used to form regions or junctions in the base semiconductor structure or foundation.

Figure 1:
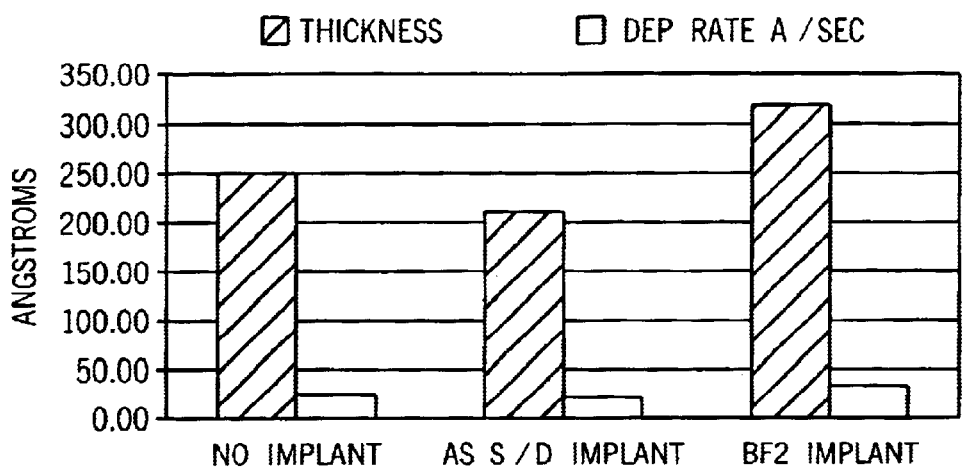
FIG. 1 is a bar graph comparing deposition rates and layer thicknesses for the selective deposition of TEOS decomposed by ozone on silicon-comprising substrates that have different conductivities.

FIG. 1 is a bar graph showing selective deposition of silicon oxide using ozone/TEOS on silicon that has been doped with an N-type dopant (arsenic; center bar) or a P-type dopant (boron; right bar) or not doped (left bar). The substrate is composed of a single crystal silicon wafer, which has been implanted with the specified dopant. The surface was subjected to a hydrogen fluoride dip prior to the ozone/TEOS deposition processing. A blanket layer of silicon oxide was deposited on the wafer surface by ozone decomposition of TEOS at a temperature of about 400° C. and a pressure of about 300 torr. Under these reaction conditions, about five liters per minute of oxygen, containing about 10% by weight ozone, and about 350 milligrams per minute of TEOS were supplied to the deposition vessel.

As shown in FIG. 1, a P-type implant, in this case boron difluoride, in a silicon-comprising substrate (polysilicon) obtains a higher deposition rate (approximately 22% faster) of oxide and reaches a greater deposition thickness for a given time than non-doped silicon. In contrast, an N-type implant, in this case arsenic, in a silicon-comprising substrate (polysilicon) retards the deposition rate (approximately 14% slower) of oxide as compared to non-doped silicon and results in a lower thickness. Similar results are obtained when the N-type implant is phosphorous. As such, the oxide deposits approximately 33% faster on P-type silicon than on N-type silicon. The selectivity effect is more pronounced at higher concentrations of dopant. Additionally, the selectivity increases as the reaction temperature decreases and/or the reaction pressure increases.

Figure 2:
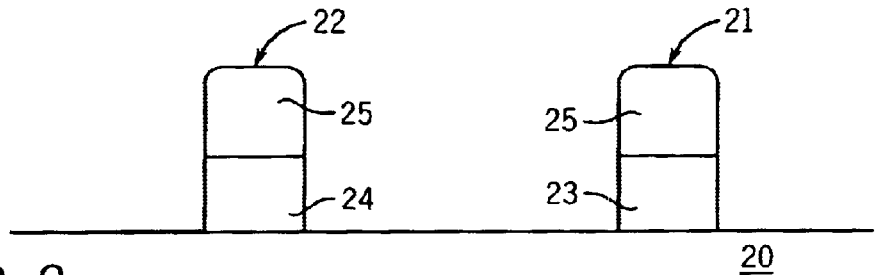
FIG. 2 is a cross-sectional view of a silicon-comprising substrate having an N-type silicon-comprising protrusion and a P-type silicon-comprising protrusion.
Figure 3:
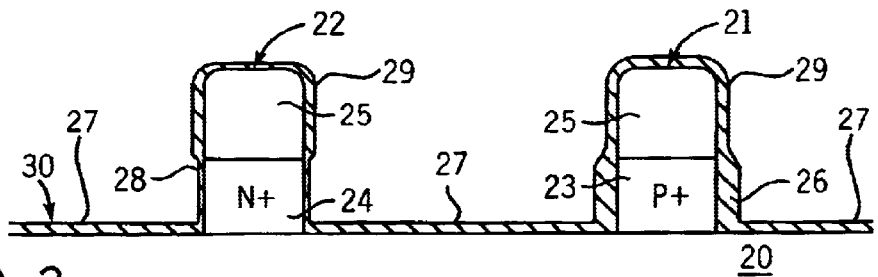
FIG. 3 shows the substrate of FIG. 2 following selective depositing of silicon oxide.
Figure 4:
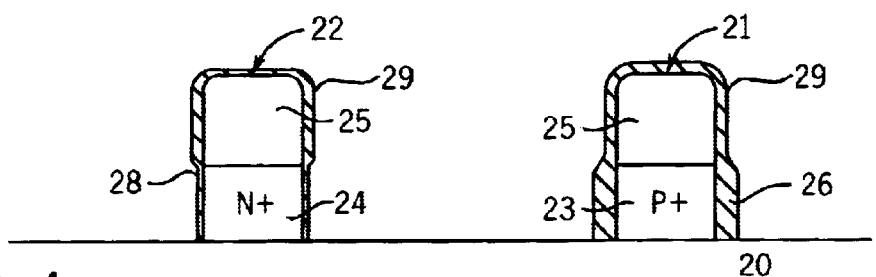
FIG. 4 shows the substrate of FIG. 3 following an etch processing step.

FIGS. 2–4 shows a typical embodiment of the process of this invention, in which two non-abutting structures or protrusions 21, 22 are arrayed on a silicon-comprising substrate 20 such as single crystal silicon, epitaxial silicon or polysilicon. Protrusion 21 has a P-type doped silicon layer 23. Protrusion 22 has an N-type doped silicon layer 24. Protrusions 21 and 22 each have a metalized film 25, such as tungsten silicide, arrayed atop the doped polysilicon layers 23 and 24, respectively.

The substrate 20 (single crystal) and protrusions 21 and 22 are contacted with gaseous ozone and gaseous TEOS under conditions where a silicon oxide layer 30 is deposited over the substrate and protrusions as shown in FIG. 3. At the proper reaction conditions, the silicon oxide will deposit selectively onto the substrate and protrusions in a single process step. The selectivity of this single process step avoids the necessity of masking and performing multiple photolithographic steps to form a suitably thick oxide layer or spacer 30 over the component layers of the protrusions 21, 22 and the substrate 20. As shown a thicker layer 26 is formed over the P-type layer 23. An intermediate thickness layer 27 is deposited over non-doped silicon substrate 20. A thinner layer 28 is deposited over the N-type silicon layer 24. An intermediate thickness layer 29 is deposited over metalized silicide film layer 25.

Appropriate reaction conditions for the selective deposition of silicon oxide over materials with different type doping is similar to the reaction conditions used in conventional methods to obtain selective deposition on silicon versus silicon nitride. Such reaction conditions are known in the art as shown in U.S. Pat. No. 5,665,644, incorporated herein by reference. Typically, the reaction temperature is greater than about 200° C. up to about 500° C., preferably up to about 400° C. Generally, the selectivity of the deposition is more pronounced at lower reaction temperatures. The reaction pressure is at least about 10 torr, preferably at least about 300 torr up to about atmospheric pressure, more preferably up to about 600 torr An exemplary reaction supplies about five liters per minute of oxygen containing about 10% by weight ozone and about 350 milligrams per minute TEOS. The oxygen: ozone ratio may typically vary from about 2 parts oxygen: 1 part ozone to about 20 parts oxygen: 1 part ozone. The ozone: TEOS ratio typically varies from about 0.5: 1 to about 200: 1. Reaction times will vary depending on the desired thickness of the deposited layer, generally about 2–3 minutes.

Optionally, the surface to receive the oxide layer may be wet cleaned in a dip prior to depositing the oxide layer. A hydrofluoric acid (HF) wet-clean dip provides a marginal enhancement of the selectivity of the deposition. Other wet-clean dips, such as sulfuric acid or non-fluorine type etchants, have not been found to enhance the selectivity of the deposition and may negatively affect the subsequent deposition.

Following the deposition of the oxide layer 30, the portion of the oxide layer 27 overlying the substrate 20 is selectively etched to expose the substrate 20, resulting in the structure of FIG. 4 having the oxide layers 26, 28 remaining over the protrusions 21, 22, respectively. Any suitable oxide etching method may be used to remove the oxide layer 27 and expose the substrate 20. Preferably, the method provides an anisotropic etch. Suitable etching methods include directional methods such as reactive ion etching (RIE). An exemplary etching process is by RIE using a mixture of carbon tetrafluoride ($CF_4$) at a flow of about 15 standard cubic centimeters per minute (sccm), and methylene trifluoride ($CHF_3$) at 25 sccm for thirty seconds at about 200 millitorr and a power of 100 watts.

In one preferred embodiment, the protrusions 21, 22 of FIG. 2 represent wordlines of different conductivity. In this embodiment, layer 23 represents a wordline comprising P-doped silicon and layer 24 represents a wordline comprising N-doped silicon. These wordlines can be incorporated into a memory unit, such as a dynamic random access memory (DRAM), by any suitable means known in the art.

In another preferred embodiment of the invention, the protrusions 21, 22 represent a dual gate structure. In this embodiment, layer 23 in FIG. 2 represents a gate comprising P-doped silicon and layer 24 represents a gate comprising N-doped polysilicon.

Figure 5:
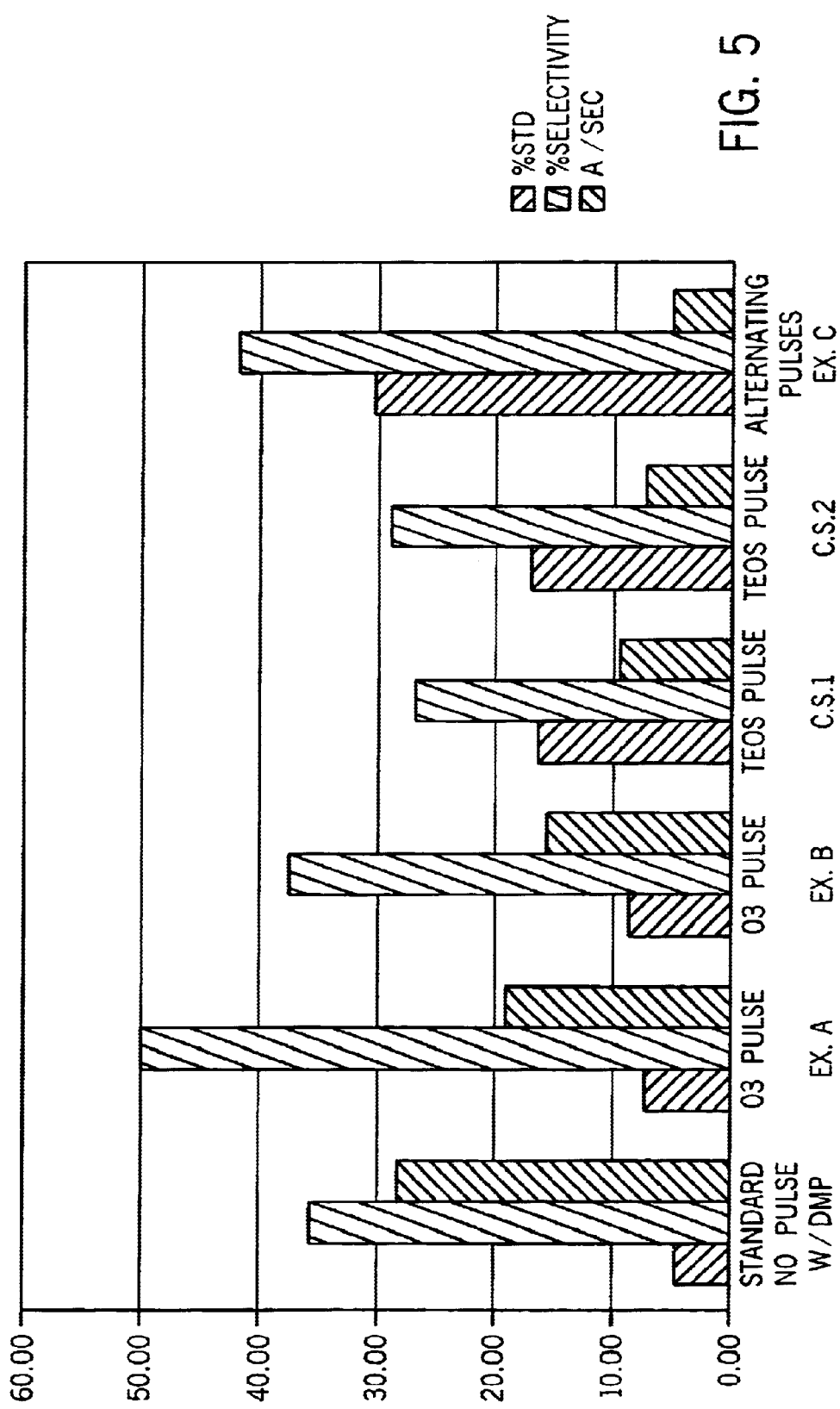
FIG. 5 shows a scanning electromicrograph (SEM) of a silicon substrate demonstrating the selective deposition of silicon oxide onto silicon substrates of different conductivity types.

In another embodiment of the invention, blanket layers of oxide using ozone/TEOS deposition processing are deposited over a silicon substrate having differentially doped areas. FIG. 5 is a SEM photomicrograph showing a cross-section of a silicon substrate 100 upon which this invention has been enacted. A transistor 114 is disposed on the surface of the substrate 100. The portion 102 of substrate 100 has been doped with a P-type conductivity enhancing dopant such as boron, and portion 104 of the substrate 100 has been doped with an N-type dopant such as phosphorus. The intermediate (dark) layer 106 immediately above the substrate 100 and the transistor 114 is an oxide layer 106 formed from an ozone/TEOS deposition. The outermost (white) layer 112 above the oxide layer 106 is a deposited titanium nitride cap layer. As shown in FIG. 5, the silicon oxide layer 106 deposited as a significantly thicker layer 108 over the P-type doped portion 102 of the silicon substrate 100 compared to the thinner layer 110 deposited over the N-type doped portion 104 of the silicon substrate 100.

The methods and devices of the current invention are useful whenever semiconductors are fabricated with silicon-comprising regions or structures having different type conductivities. Examples of useful applications include memory arrays, such as DRAM and static random access memory (SRAM), logic circuitry, and combinations of memory and logic, such as a system-on-chip array.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor processing method of forming spacers of variable thicknesses, the method comprising the steps of:
   providing a silicon-comprising substrate having a surface comprising at least one first conductive region comprising either P-type silicon or non-doped silicon and at least one second conductive region, provided that:
   (1) when the first conductive region comprises P-type silicon, then the second conductive region comprises either non-doped silicon or N-type silicon; and,
   (2) when the first conductive region comprises non-doped silicon, then the second conductive region comprises N-type silicon;
   depositing silicon oxide, in a single process step, to form a layer over the silicon-comprising substrate and both the first conductive region and the second conductive region, whereby a greater thickness of the silicon oxide is deposited on the first conductive region than on the second conductive region; and
   etching silicon oxide deposited on the silicon-comprising substrate to remove the silicon oxide from the surface of the silicon-comprising substrate, whereby the silicon oxide layers remaining on the first and second conductive regions provide a layer of variable thickness around the first conductive region and the second conductive region.

2. A semiconductor processing method of forming spacers of variable thicknesses, the method comprising the steps of:
   providing a silicon-comprising substrate having a surface comprising at least one first conductive region comprising either P-type silicon or non-doped silicon and at least one second conductive region, provided that:
   (1) when the first conductive region comprises P-type silicon, then the second conductive region comprises either non-doped silicon or N-type silicon; and,
   (2) when the first conductive region comprises non-doped silicon, then the second conductive region comprises N-type silicon;
   decomposing tetraethylorthosilicate with ozone to selectively deposit silicon oxide over the silicon surface and over both the first conductive region and the second conductive region, whereby a greater thickness of the silicon oxide is deposited on the first conductive region than on the second conductive region; and,
   etching the silicon oxide deposited on the silicon-comprising substrate to remove silicon oxide from the surface of the silicon-comprising substrate, whereby the silicon oxide layers remaining on the first and second conductive regions provide a layer of variable thickness around the first conductive region and the second conductive region.

3. A semiconductor processing method of forming spacers of variable thicknesses, the process comprising the steps of:
   providing a silicon-comprising substrate having a surface comprising at least one first conductive region comprising either P-type silicon or non-doped silicon and at least one second conductive region, provided that:
   (1) when the first conductive region comprises P-type silicon, then the second conductive region comprises either non-doped silicon or N-type silicon; and,
   (2) when the first conductive region comprises non-doped silicon, then the second conductive region comprises N-type silicon;

contacting the silicon-comprising substrate with ozone and tetraethylorthosilicate whereby the first conductive region and the second conductive region are in intimate contact with the ozone and the tetraethylorthosilicate;

reacting the ozone and the tetraethylorthosilicate at a temperature up to about 500° C. and a pressure of at least about 10 torr to selectively deposit silicon oxide over the silicon-comprising substrate surface and both the first conductive region and the second conductive region, whereby a greater thickness of the silicon oxide is deposited on the first conductive region than on the second conductive region; and, etching the silicon oxide deposited on the silicon-comprising substrate to remove silicon oxide from the surface of the silicon-comprising substrate, whereby the silicon oxide layers remaining on the first and second conductive regions provide a layer of variable thickness around the first conductive region and the second conductive region.

4. The method of claim 3, wherein the reaction occurs at a temperature up to about 400° C.

5. The method of claim 3, wherein the reaction occurs at a pressure of at least about 300 torr.

6. A semiconductor processing method of forming spacers of variable thicknesses, the meted comprising the steps of:

providing a silicon-comprising substrate having a surface comprising at least one first protrusion comprising either P-type silicon or non-doped silicon and at least one second protrusion, provided that:
(1) when the first protrusion comprises P-type silicon, then the second protrusion comprises either non-doped silicon or N-type silicon; and,
(2) when the first protrusion comprises non-doped silicon, then the second protrusion comprises N-type silicon;

depositing silicon oxide, in a single process step, over the silicon-comprising substrate surface and both the first protrusion and the second protrusion, whereby a greater thickness of the silicon oxide is deposited on the first protrusion than on the second protrusion; and, etching the silicon oxide deposited on the silicon-comprising substrate to remove silicon oxide from the surface of the silicon-comprising substrate, whereby the silicon oxide layers remaining on the first and second protrusions provide a layer of variable thickness around the first protrusion and the second protrusion.

7. A semiconductor processing method of forming spacers of variable thicknesses, the method comprising the steps of:

providing a silicon-comprising substrate having a surface comprising at least one first protrusion comprising either P-type silicon or non-doped silicon and at least one second protrusion, provided that:
(1) when the first protrusion comprises P-type silicon, then the second protrusion comprises either non-doped silicon or N-type silicon; and,
(2) when the first protrusion comprises non-doped silicon, then the second protrusion comprises N-type silicon;

decomposing tetraethylorthosilicate with ozone to selectively deposit silicon oxide over the silicon surface and both the first protrusion and the second protrusion, whereby a greater thickness of the silicon oxide is deposited on the first protrusion than on the second protrusion; and, etching the silicon oxide deposited on the silicon-comprising substrate to remove silicon oxide from the surface of the silicon-comprising substrate, whereby the silicon oxide layers remaining on the first and second protrusions provide a layer of variable thickness around the first protrusion and the second protrusion.

8. The method of claim 7, wherein the reaction occurs at a temperature up to about 400° C.

9. The method of claim 7, wherein the reaction occurs at a pressure of at least about 300 torr.

10. A semiconductor processing method of forming spacers of variable thicknesses, the method comprising the steps of:

providing a silicon-comprising substrate having a surface comprising at least one first protrusion comprising either P-type silicon or non-doped silicon and at least one second protrusion, provided that:
(1) when the first protrusion comprises P-type silicon then the second protrusion comprises either non-doped silicon or N-type silicon; and,
(2) when the first protrusion comprises non-doped silicon then the second protrusion comprises N-type silicon;

contacting the silicon-comprising substrate surface with ozone and tetraethylorthosilicate whereby the first protrusion and the second protrusion are in intimate contact with the ozone and the tetraethylorthosilicate;

decomposing the tetraethylorthosilicate with the ozone to selectively deposit silicon oxide over the silicon-comprising substrate surface and both the first protrusion and the second protrusion, whereby a greater thickness of the silicon oxide is deposited on the first protrusion than on the second protrusion; and, etching the silicon oxide deposited on the silicon-comprising substrate to remove silicon oxide from the surface of the silicon-comprising substrate, whereby the silicon oxide layers remaining on the first and second protrusions provide a layer of variable thickness around the first protrusion and the second protrusion.

11. A semiconductor processing method of forming spacers of variable thicknesses, the process comprising the steps of:

providing a silicon-comprising substrate having a surface comprising at least one first protrusion comprising either P-type silicon or non-doped silicon and at least one second protrusion, provided that:
(1) when the first protrusion comprises P-type silicon, then the second protrusion comprises either non-doped silicon or N-type silicon; and,
(2) when the first protrusion comprises non-doped silicon, then the second protrusion comprises N-type silicon;

reacting ozone and the tetraethylorthosilicate at a temperature up to about 500° C. and a pressure of at least about 10 torr to selectively deposit silicon oxide over the silicon-comprising substrate surface and both the first protrusion and the second protrusion, whereby a greater thickness of the silicon oxide is deposited on the first protrusion than an the second protrusion; and, etching the silicon oxide deposited on the silicon-comprising substrate to remove silicon oxide from the surface of the silicon-comprising substrate, whereby the silicon oxide layers remaining on the first and second protrusions provide a layer of variable thickness around the first protrusion and the second protrusion.

12. The method of claim 11, wherein the reaction occurs at a temperature up to about 400° C.

13. The method of claim 11, wherein the reaction occurs at a pressure of at least about 300 torr.

14. A semiconductor processing method of forming wordlines with spacers of variable thicknesses, the process comprising the steps of:

providing a silicon-comprising substrate having a surface comprising at least one first wordline comprising P-type silicon and at least one second wordline comprising N-type silicon, the first and second wordlines being separated on the silicon-comprising substrate;

contacting the silicon-comprising substrate with ozone and tetraethylorthosilicate whereby the first wordline and the second wordline are in intimate contact with the ozone and the tetraethylorthosilicate;

reacting the ozone and the tetraethylorthosilicate to selectively deposit silicon oxide over the silicon-comprising substrate surface and both the first wordline and the second wordline, whereby a greater thickness of the silicon oxide is deposited on the first wordline than on the second wordline; and, etching the silicon oxide deposited on the silicon-comprising substrate to remove silicon oxide from to surface of the silicon-comprising substrate, whereby the silicon oxide layers remaining on the first and second wordlines provide a layer of variable thickness around the first wordline and the second wordline.

15. A semiconductor processing method of forming wordlines with spacers of variable thicknesses, the process comprising the steps of:

providing a silicon-comprising substrate having a surface comprising at least one first wordline comprising P-type silicon and at least one second wordline comprising N-type silicon:

reacting ozone and tetraethylorthosilicate at a temperature up to about 500° C. and a pressure of at least about 10 torr to selectively deposit silicon oxide over the silicon-comprising substrate surface and both the first wordline and the second wordline, whereby a greater thickness of the silicon oxide is deposited on the first wordline than on the second wordline; and, etching the silicon oxide deposited on the silicon-comprising substrate to remove silicon oxide from the surface of the silicon-comprising substrate, whereby the silicon oxide layers remaining on the first and second wordlines provide a layer of variable thickness around the first wordline and the second wordline.

16. A semiconductor processing method of forming dual gate structures with spacers of variable thickness, the process comprising the steps of:

providing a silicon-comprising substrate having a surface comprising at least one first gate comprising P-type silicon and at least one second gate comprising N-type silicon:

contacting the silicon-comprising substrate with ozone and tetraethylorthosilicate whereby the first gate and the second gate are in intimate contact with the ozone and the tetraethylorthosilicate;

reacting the ozone and the tetraethylorthosilicate to selectively deposit silicon oxide over the silicon-comprising substrate surface and both the first gate and the second gate, whereby a greater thickness of the silicon oxide is deposited on the first gate than on the second gate; and, etching the silicon oxide deposited on the silicon-comprising substrate to remove silicon oxide from the surface of the silicon-comprising substrate, whereby the silicon oxide layers remaining on the first and second gates provide a layer of variable thickness around the first gate and the second gate.

17. A semiconductor processing method of forming dual gate structures with spacers of valuable thicknesses, the process comprising the steps of:

providing a silicon-comprising substrate having a surface comprising at least one first gate comprising P-type silicon and at least one second gate comprising N-type silicon:

reacting ozone and tetraethylorthosilicate at a temperature up to about 500° C. and a pressure of at least about 10 torr to selectively deposit silicon oxide over the silicon-comprising substrate surface and both the first gate and the second gate, whereby a greater thickness of the silicon oxide is deposited on the first gate than on the second gate; and, etching the silicon oxide deposited on the silicon-comprising substrate to remove silicon oxide from the surface of the silicon-comprising substrate, whereby the silicon oxide layers remaining on the first and second gates provide a layer of variable thickness around the first gate and the second gate.

18. The method of claim 17, wherein the reaction occurs at a temperature up to about 400° C.

19. The method of claim 17, wherein the reaction occurs at a pressure of at least about 300 torr.

* * * * *

UNITED STATES PATENT AND TRADEMARK OFFICE
CERTIFICATE OF CORRECTION

PATENT NO.     : 6,617,230 B1
DATED          : September 9, 2003
INVENTOR(S)    : William Budge et al.

It is certified that error appears in the above-identified patent and that said Letters Patent is hereby corrected as shown below:

<u>Column 7,</u>
Line 25, replace "meted" with -- method --.

Signed and Sealed this

Twenty-first Day of October, 2003

JAMES E. ROGAN
*Director of the United States Patent and Trademark Office*